(12) United States Patent
Barnette et al.

(10) Patent No.: US 6,316,944 B1
(45) Date of Patent: Nov. 13, 2001

(54) EFFECTIVE NETLENGTH CALCULATION

(75) Inventors: Christopher M. Barnette, Dallas; Terrel L. Morris, Garland; Douglas B. Fail; Marvin D. Ross, both of Dallas, all of TX (US)

(73) Assignee: Hewlett Packard Company, Palo Alto, CA (US)

( * ) Notice: Subject to any disclaimer, the term of this patent is extended or adjusted under 35 U.S.C. 154(b) by 0 days.

(21) Appl. No.: 09/562,596

(22) Filed: Apr. 29, 2000

(51) Int. Cl.[7] .................................................. G01R 27/28
(52) U.S. Cl. .................. 324/617; 324/158.1; 324/76.35; 702/125
(58) Field of Search .................................... 324/617, 765, 324/627, 628, 76.35, 76.54, 532, 535, 158.1; 702/125

(56) References Cited

U.S. PATENT DOCUMENTS

| | | | | |
|---|---|---|---|---|
| 4,587,480 | * | 5/1986 | Zasio ..................................... | 324/310 |
| 4,939,677 | * | 7/1990 | Otuji et al. ............................ | 702/125 |
| 5,208,213 | * | 5/1993 | Ruby ..................................... | 505/210 |
| 5,926,589 | * | 7/1999 | Gaeta ..................................... | 385/16 |

* cited by examiner

*Primary Examiner*—Glenn W. Brown
*Assistant Examiner*—Vincent Q. Nguyen

(57) ABSTRACT

The invention accurately determines propagation delay for a sawtooth pattern. Through measurement, the actual delays added per bend in the sawtooth pattern are determined and the values are then used in a CAD tool. The invention can add a known amount of propagation delay to a wire length by routing net wires close together without using a large amount of board space.

20 Claims, 3 Drawing Sheets

EFFECTIVE NETLENGTH CALCULATION

BACKGROUND

Printed circuit boards (PCBs) connect chip devices together, as well as couple the devices to external components such as keyboards and storage devices. PCBs use wires or nets for the connections. Some devices have multiple wires that send and/or receive data bits substantially simultaneously. The time that it takes for data to traverse the wires is known as propagation delay. Note that differences in the wire lengths will causes differences in the time of transit of the data bits. These differences are known as skew. Acceptable skew is generally less than one clock cycle. Thus, signals arriving within one clock cycle are treated as having arrived simultaneously by the receiving device. Signals arriving with a time differential of greater than one clock cycle are treated as having arrived in different clock cycles. If a signal was to arrive in the wrong clock cycle, then the skew can cause the system to crash.

FIG. 1 depicts some of the nets on a PCB board 100. The board includes drivers 101 that transmit signals and receivers 102 that receive the signals sent by the drivers. Connecting wiring 103 connects the drivers to the receivers. The wiring is also known as the net. Net length is the length of the wires. As shown in FIG. 1, some drivers are located closer to their associated receivers, than other driver/receiver pairs. Also boards have features, e.g. mounting holes 104, surface mounted devices, etc., such that the wiring must be routed around the features. Thus, the propagation delay for pair 101B/102B will be less than delay for pair 101A/102A if straight wiring is used. To increase the path length, the wiring is formed in a square wave or sawtooth pattern 105, such that the additional path length added by the pattern 105 should increase the total path length for the 101B/102B pair such that it equals the path length for the 101A/102A pair.

A problem with this arrangement is that the physical length added by the sawtooth pattern, namely the vertical portions of the pattern, does not equal the intended propagation delay. Physically the pattern should produce the intended propagation delay, however, the actual propagation delay is less than expected. In other words, the current path is shorter than the predicted physical path. The predicted propagation delay is formed by a CAD tool, which measures distance from the center line of the wire. The predicted delay equals the physical length times a constant (delay per length). But the real current path does not follow the center line, the real current path follows a shorter path and cuts the corners of the bends of the pattern. Note that this differential is very small, but is multiplied by the number of bends. Thus, for wires with a few sawteeth, the wire behaves as is predicted, but as the number of teeth increases, the resulting propagation delay begins to vary from the predicted or intended value. In the past, this problem has been ignored as its effects were not important because of slower computer speeds. However, as computer speeds have increased, this problem has become more important.

One prior art solution is to use delay lines 201, as shown in FIG. 2. The delay line is a manufactured wire, that has a built in delay. However, the delay lines are not accurate. In other words, two delay lines with the same rating will have different delays, i.e. they are unpredictable. Also, the delay wires require attachment vias which uses board space. Moreover, the delay wires are predefined, and a particular delay may not be attainable with the predefined delay lines.

Another prior art solution is to use few teeth, but with longer vertical distances, as shown in FIG. 3. This is known as a trombone pattern 301. Such a pattern would have the same amount of vertical space as the sawtooth pattern 105, but with fewer bends. Since there are fewer bends, then the current path is closer to the predicted path and the actual delay is closer to the predicted delay. However, this arrangement requires a great deal of board space. Also, since the wires are close together for relatively long distances, the wires can have cross-talk, that would change the timing of the signal travel. In other words, the signal may couple energy onto one or more of the vertical paths and arrive sooner than expected to the receiver.

SUMMARY OF THE INVENTION

These and other objects, features and technical advantages are achieved by a system and method that accurately determines propagation delay for a sawtooth pattern.

Through measurement, the actual delays added per bend in the sawtooth pattern are determined. These values are then used in a CAD tool. The CAD tool can then accurately determine the propagation delay for a sawtooth pattern. Note that other patterns can be used as well, for example, a 45 degree bend pattern or triangle tooth pattern.

Therefore, it is a technical advantage of the present invention to be able to add a known amount of propagation delay to a wire length.

It is another a technical advantage of the present invention to be able to add a known amount of propagation delay to a wire length without using a large amount of board space.

It is a further technical advantage of the present invention to be able to route net wires close together in a smaller amount of board space.

It is a still further technical advantage of the present invention to be able to add a propagation delay by using a repeatable structure.

It is a still further technical advantage of the present invention to be able to test the predicted delay values and add more teeth if needed.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

Figure 1:
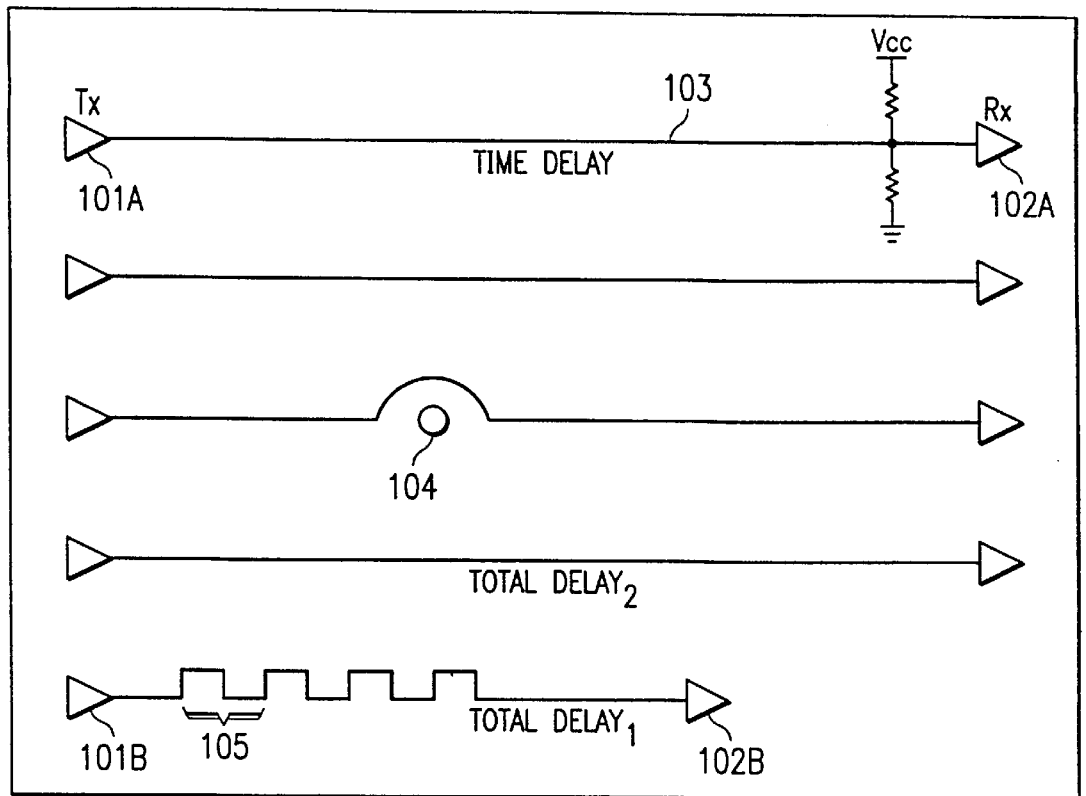
FIG. 1 depicts a PCB board that includes wires that connects drivers to receivers, wherein a wire includes a saw tooth pattern to add propagation delay to the wire.
Figure 2:
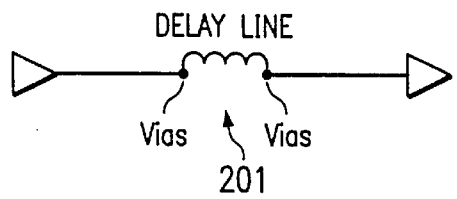
FIG. 2 depicts a delay line that is used to add propagation delay to a wire.
Figure 3:
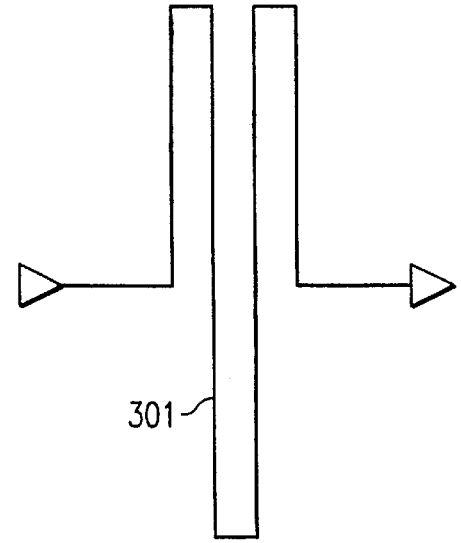
FIG. 3 depicts a trombone pattern that is used to add propagation delay to a wire.
Figure 4:
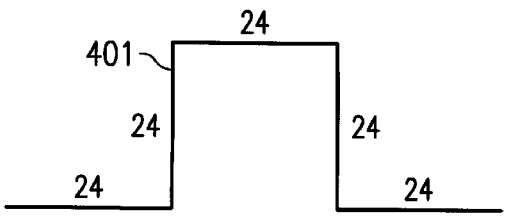
FIG. 4 depicts the predicted propagation delay for a single saw tooth wire.
Figure 5:
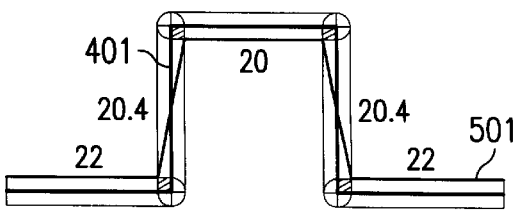
FIG. 5 depicts the expected current path for a saw tooth wire.

As discussed above, a CAD tool will predict the propagation delay based on wire length. FIG. 4 depicts such a prediction for a single saw tooth. In this case, the CAD tool predicts a propagation delay of 120 mils, with 24 mils from each leg. Note that the single saw tooth 401 is predicted to add a total of 48 to the propagation delay, as a straight line wire would have a delay of 72. The path 401 represents the center line of a wire of a given thickness, which may be viewed as a zero mil width wire. Note that the values are for purposes of illustration only, as other values would arise from other distances. FIG. 5 depicts the expected path for a saw tooth that a signal should take, knowing that the signal will cut the corners of the bends. In other words, the signal should take the shortest path 501. In this case, the wire is assumed to have a width of 4 mils. Thus the shortest path 501 is shorter than the predicted path 401, i.e. path 501 is 104.8 mils, which is 15.2 mils (or 13%) shorter than path 401. Note that the values are for purposes of illustration only, as other values would arise from other distances and widths.

Figure 6:
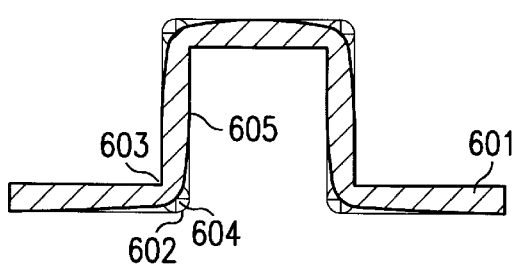
FIG. 6 depicts the measured current path for a saw tooth wire.

Through measurements, the actual path 601 for a single saw tooth taken is shown in FIG. 6. This path is different from the expected shortest path 501. This path 601 is longer than 501. Note that in the corners 602, a portion of the corner is bare, but the signal approximately flows from the bend 603 to the mid-point of the bend 604. The signal current is concentrated on inside portion of each of the bends, but does not concentrate at the bends. The signal then moves to fill the entire wire width 605 after the bend. Thus, in calculating the path, in the bends, the center line of path 601 is between the inside bend and the center of the wire, and away from the bends, the center line is the center of the wire width. The result is it that each 90 degree bend is 2.421 mils shorter than the value calculated by the CAD tools. A sawtooth with four right angles and 24 mils per would be 120 mils−4*2.421 mils=110.316 mils. Note that the values are for purposes of illustration only, as other values would arise from other distances and widths.

Figure 7:
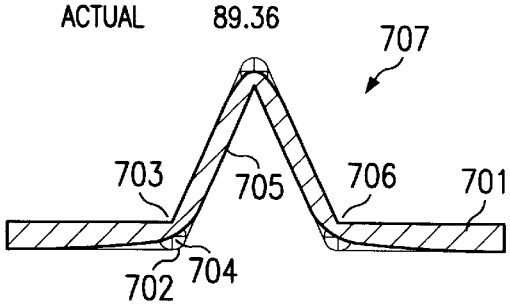
FIG. 7 depicts the measured current path for a triangle tooth wire.

FIG. 7 depicts the measured path 701 a single triangular tooth. Such a tooth could be replicated many times to from a triangle tooth pattern. The tooth is formed from two 45 degree bends 702, 706 and one 90 degree bend 707. The 90 degree bend behaves as described with regards to FIG. 6. Note that in the 45 degree corners 702, a portion of the corner is bare, but the signal approximately flows from the bend 703 to the mid-point of the bend 704. The signal current is concentrated on inside portion of each of the bends, but does not concentrate at the bends. The signal then moves to fill the entire wire width 705 after the bend. Thus, in calculating the path, in the bends, the center line of path 701 is between the inside bend and the center of the wire, and away from the bends, the center line is the center of the wire width. The result is it that each 45 degree corner is 2.011 mils shorter than the predicted value. A triangle tooth with two 45 degree angles, one 90 degree angle, and 24 mils per leg would be 96−2(2.011)−2.421=89.359. Note that the values are for purposes of illustration only, as other values would arise from other distances and widths.

Figure 8:
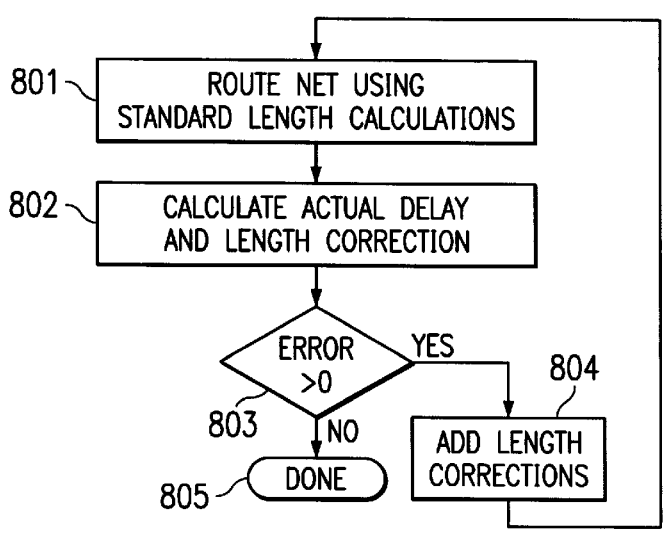
FIG. 8 depicts a method for calculating error between the path of FIG. 4 and the path of FIGS. 6 and 7.

The actual values from FIGS. 6 and 7 can be used in two ways. The first is shown in FIG. 8, as uses existing tools. The tool would calculate a net 801, with sawteeth using the predicted values of FIG. 4. A second calculation 802 would be performed on the results of step 801 to determine the error in the prediction using the values from FIGS. 6 and 7. If the error is greater than zero 803 (zero being a distance less than delay added by one tooth), then additional teeth are added 804 using the values of FIG. 4. The net is then re-calculated by the tool 801. Note that the additional teeth will also have an error. The second calculation 802 is re-done, and the error re-determined. The steps repeat until the error is zero 805, at which point the method is complete. Note that zero may also be some other tolerance level that the system can operate with.

The second way is the reconfigure the tool to use the values of FIGS. 6 and 7. This would allow for one calculation to be performed. The single calculation would determine a proper net route with zero error (as defined above). The tool would then determine the number of saw teeth or triangle teeth would be needed based on tooth geometry, wire widths, height, and width of the teeth.

Figure 9A:
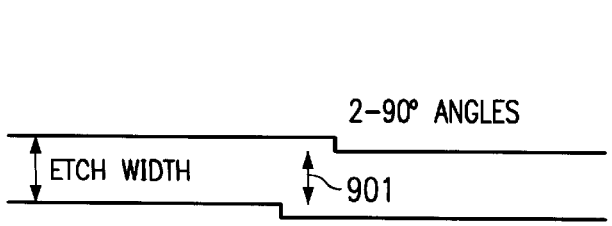
FIGS. 9A and 9B depict special case wire bends.
Figure 9B:
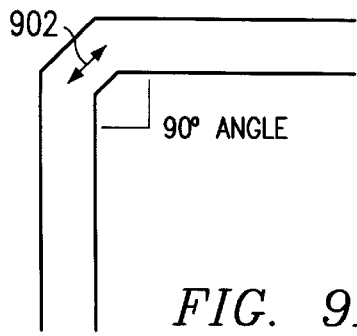

Certain bends will not introduce errors. These bends are shown in FIGS. 9A and 9B. FIG. 9A depicts a jog or dog-leg in the wire. These bends comprises two 90 degree bends in close proximity with each other. These bends will not introduce any error if the jog 901 is less than the wire width. In other words if the distance between the center line of the first wire and the center line of the second wire is less than the width of the wire, then no error will be introduced. The values predicted by FIG. 4 can be used. FIG. 9B depicts two 45 degree bends in close proximity with each other. If the 45 degree bends are less than a wire width apart, then these bends will only introduce the error of one 90 degree bend, and not two 45 degree bends. In other words if the distance between the center of the first 45 bend and the center of the second 45 degree bend is less than the width of the wire, then only the error of one 90 degree bend will be introduced.

Figure 10:
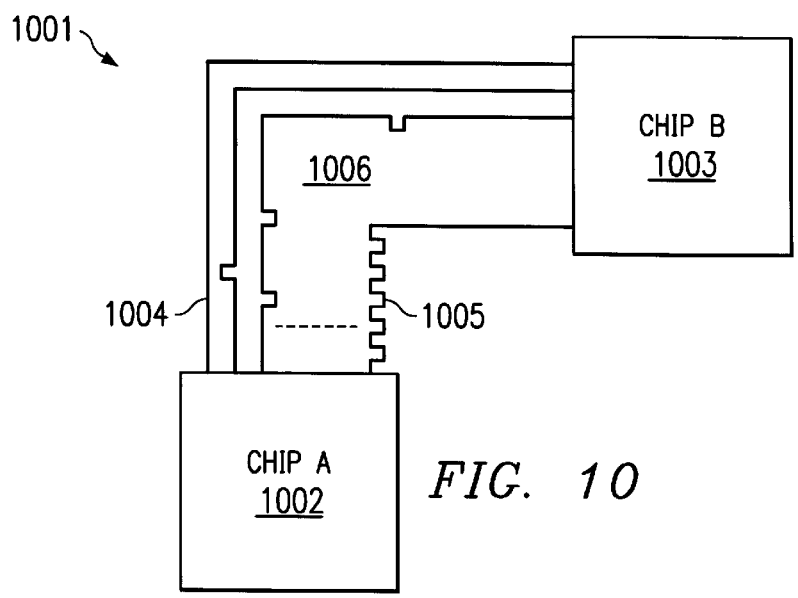
FIG. 10 depicts a net routing arrangement developed by using the invention.

FIG. 10 depicts a net routing arrangement developed by using the invention. The net 1001 connects chip A 1002 and chip B 1003. The longest wire 1004 does not have any teeth, and is the path length that the other wires should approximately equal. The shortest wire 1005 has the most teeth. The wires 1006 between the longest and the shortest have fewer teeth as the wire length increases.

Figure 11:
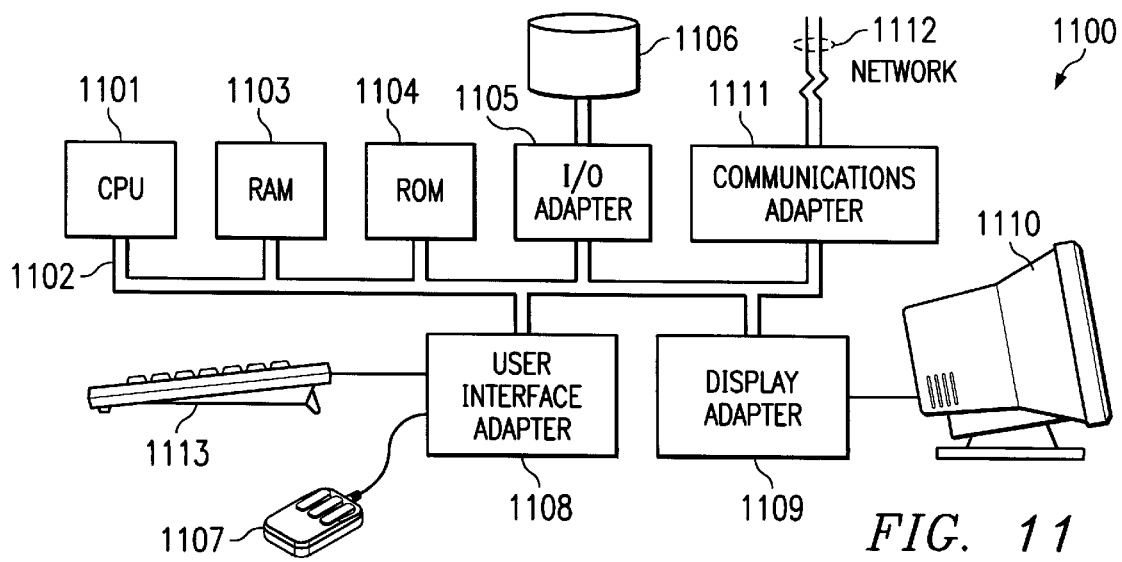
FIG. 11 depicts a block diagram of a computer system which is adapted to use the present invention.

FIG. 11 illustrates computer system 1100 adapted to use the present invention. Central processing unit (CPU) 1101 is coupled to system bus 1102. The CPU 1101 may be any general purpose CPU, such as an HP PA-8500 or Intel Pentium processor. However, the present invention is not restricted by the architecture of CPU 1101 as long as CPU 1101 supports the inventive operations as described herein. Bus 1102 is coupled to random access memory (RAM) 1103, which may be SRAM, DRAM, or SDRAM. ROM 1104 is also coupled to bus 1102, which may be PROM, EPROM, or EEPROM. RAM 1103 and ROM 1104 hold user and system data and programs as is well known in the art.

The bus 1102 is also coupled to input/output (I/O) controller card 1105, communications adapter card 1111, user interface card 1108, and display card 1109. The I/O card 1105 connects to storage devices 1106, such as one or more of hard drive, CD drive, floppy disk drive, tape drive, to the computer system. Communications card 1111 is adapted to couple the computer system 1100 to a network 1112, which may be one or more of local (LAN), wide-area (WAN), Ethernet or Internet network. User interface card 1108 couples user input devices, such as keyboard 1113 and pointing device 1107, to the computer system 1100. The display card 1109 is driven by CPU 1101 to control the display on display device 1110.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. The method for configuring the propagation delay for a model of a net wire connecting a first device and a second device to a desired propagation delay, the method comprising the steps of:

(a) determining whether a current propagation delay for the model of the net wire is equal to the desired propagation delay;

(b) adding a number of wire structures to the model of the net wire, if the current propagation delay is less than the desired propagation delay, wherein the number is based on the difference between the desired propagation delay and the current propagation delay, and wherein each wire structure adds a predetermined amount of propagation delay; and (c) repeating steps (a) and (b) until the difference is less than the predetermined amount of propagation delay added by each wire structure;

wherein the predetermined amount of propagation delay for the wire structure includes a correction factor for a shortened current path around at least one bend in the wire structure.

2. The method of claim 1 wherein the correction factor is determined by measurement of actual values.

3. The method of claim 1 wherein step (b) further comprises the steps of:

determining a model propagation delay for the wire structure; and subtracting the correction factor from the model propagation delay to form the predetermined amount of propagation delay.

4. The method of claim 1 wherein step (b) further comprises the steps of:

determining the number of wire structures based on a model propagation delay for the wire structure;

determining an intermediate current propagation delay based on the model propagation delays; and subtracting the correction factor multiplied by the number of wire structures, from the intermediate current propagation delay to form the current propagation delay.

5. The method of claim 1 wherein:

the wire structure has a profile of a half cycle of a triangle wave and includes one 90 degree bend and two 45 degree bends.

6. The method of claim 1 wherein:

the wire shape includes two 45 degree bends that are less than a width of the wire apart, whereby the correction factor for the wire shape is the correction factor for a 90 degree bend.

7. The method of claim 1 wherein:

the wire shape includes two 90 degree bends that are less than a width of the wire apart, whereby the correction factor is zero.

8. The method of claim 1 wherein:

the wire structure has a profile of a half cycle of a square wave and includes four 90 degree bends.

9. The method of claim 8 wherein:

the wire width is 4 mils; and the correction factor 2.421 mils.

10. The method of claim 8 wherein:

the wire width is 4 mils;

the correction factor 2.421 mils for the 90 degree bend; and the correction factor 2.011 mils for the 45 degree bend.

11. A tool for configuring the propagation delay for a model of a net wire connecting a first device and a second device to a desired propagation delay, the tool comprising:

means for determining whether a current propagation delay for the model of the net wire is equal to the desired propagation delay; and means for adding a number of wire structures to the model of the net wire, if the current propagation delay is less than the desired propagation delay, wherein the number is based on the difference between the desired propagation delay and the current propagation delay, and wherein each wire structure adds a predetermined amount of propagation delay;

wherein the means for determining and adding are operative until the difference is less than the predetermined amount of propagation delay added by each wire structure; and wherein the predetermined amount of propagation delay for the wire structure includes a correction factor for a shortened current path around at least one bend in the wire structure.

12. The tool of claim 11 wherein the correction factor is determined by measurement of actual values.

13. The tool of claim 11 wherein:

predetermined amount of propagation delay is determined by subtracting the correction factor from a model propagation delay for the wire structure.

14. The tool of claim 11 wherein the means for adding further comprises:

means for determining the number of wire structures based on a model propagation delay for the wire structure;

means for determining an intermediate current propagation delay based on the model propagation delays; and means for subtracting the correction factor multiplied by the number of wire structures, from the intermediate current propagation delay to form the current propagation delay.

15. The tool of claim 11 wherein:

the wire shape includes two 45 degree bends that are less than a width of the wire apart, whereby the correction factor for the wire shape is the correction factor for a 90 degree bend.

16. The tool of claim 11 wherein:

the wire shape includes two 90 degree bends that are less than a width of the wire apart, whereby the correction factor is zero.

17. The tool of claim 11 wherein:

the wire structure has a profile of a half cycle of a square wave and includes four 90 degree bends.

18. The tool of claim 17 wherein:

the wire width is 4 mils; and the correction factor 2.421 mils.

19. The tool of claim 11 wherein:

the wire structure has a profile of a half cycle of a triangle wave and includes one 90 degree bend and two 45 degree bends.

20. The tool of claim 19 wherein:

the wire width is 4 mils;

the correction factor 2.421 mils for the 90 degree bend; and the correction factor 2.011 mils for the 45 degree bend.

* * * * *